(12) United States Patent
Akabane

(10) Patent No.: US 11,295,967 B2
(45) Date of Patent: Apr. 5, 2022

(54) SAMPLE HOLDER

(71) Applicant: KYOCERA Corporation, Kyoto (JP)

(72) Inventor: Kenichi Akabane, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 114 days.

(21) Appl. No.: 16/611,436

(22) PCT Filed: May 28, 2018

(86) PCT No.: PCT/JP2018/020286
§ 371 (c)(1),
(2) Date: Nov. 6, 2019

(87) PCT Pub. No.: WO2018/221436
PCT Pub. Date: Dec. 6, 2018

(65) Prior Publication Data
US 2020/0211869 A1 Jul. 2, 2020

(30) Foreign Application Priority Data
May 29, 2017 (JP) .............................. JP2017-105734

(51) Int. Cl.
| | | |
|---|---|---|
| *H05B 3/68* | (2006.01) | |
| *H01L 21/67* | (2006.01) | |
| *H01L 21/683* | (2006.01) | |
| *H05B 3/26* | (2006.01) | |

(52) U.S. Cl.
CPC .... *H01L 21/67103* (2013.01); *H01L 21/6833* (2013.01); *H05B 3/265* (2013.01); *H05B 2203/002* (2013.01)

(58) Field of Classification Search
CPC ........... H01L 21/67103; H01L 21/6833; H01L 21/02; H01L 21/67109; H05B 2203/002; H05B 3/265; H05B 3/143; H05B 3/283; H05B 3/68
USPC .... 219/443.1–468.2, 541–548; 338/306–314
See application file for complete search history.

(56) References Cited

U.S. PATENT DOCUMENTS

| | | | | |
|---|---|---|---|---|
| 5,344,492 A | * | 9/1994 | Sato | .................... C23C 16/4586 |
| | | | | 118/724 |
| 5,374,807 A | * | 12/1994 | Yahav | ...................... H05B 3/68 |
| | | | | 219/466.1 |
| 6,080,970 A | * | 6/2000 | Yoshida | .................. C23C 16/46 |
| | | | | 219/444.1 |
| 2008/0017632 A1 | * | 1/2008 | Maki | ...................... H05B 3/143 |
| | | | | 219/543 |
| 2008/0066682 A1 | * | 3/2008 | Yamashita | .............. H01J 37/20 |
| | | | | 118/723 VE |

FOREIGN PATENT DOCUMENTS

| | | |
|---|---|---|
| JP | 2006-013199 A | 1/2006 |
| JP | 2006-066742 A | 3/2006 |
| JP | 2017-010884 A | 1/2017 |

* cited by examiner

*Primary Examiner* — Sang Y Paik
(74) *Attorney, Agent, or Firm* — Volpe Koenig

(57) ABSTRACT

A sample holder includes: a ceramic body including a one main surface, and a sample holding surface on the one main surface; a heat-generating resistor disposed on an other main surface of the ceramic body; and a plurality of grooves arranged in a lattice on a surface of the heat-generating resistor, the plurality of grooves having extending directions that are different on different portions of the surface of the heat-generating resistor.

6 Claims, 6 Drawing Sheets

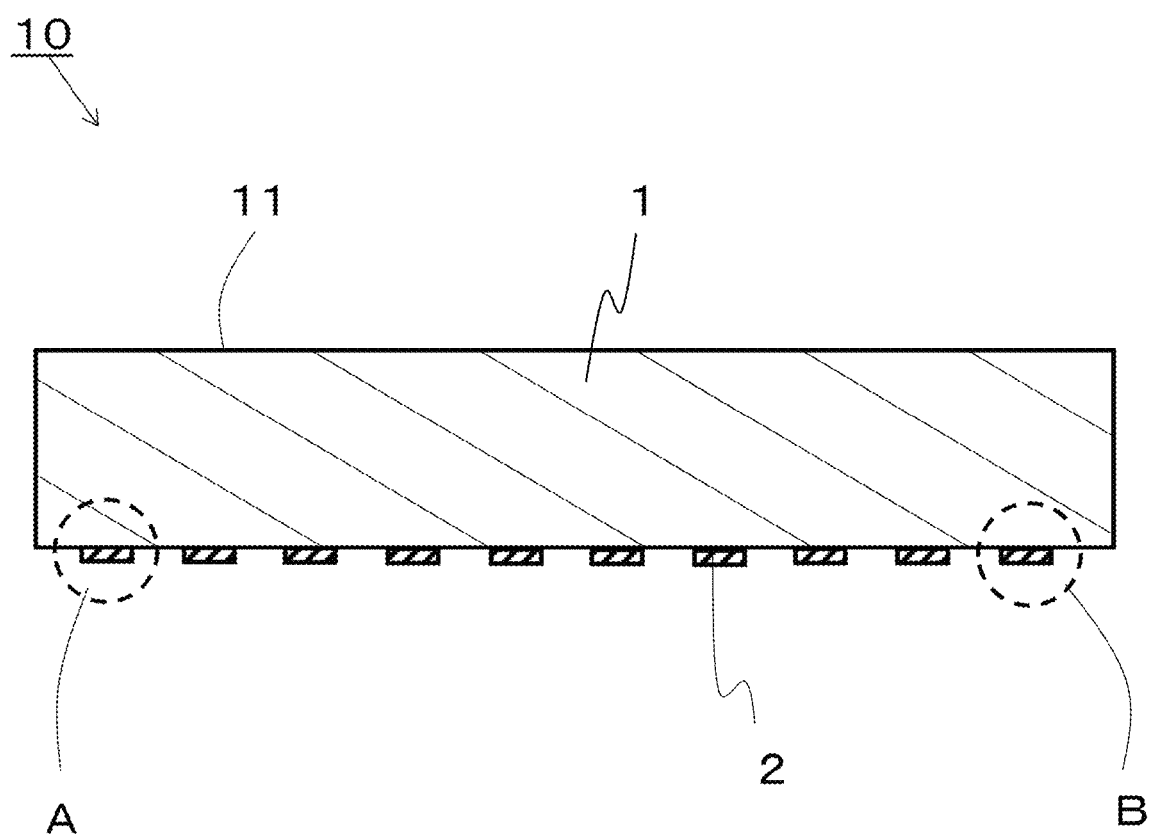

SAMPLE HOLDER

CROSS-REFERENCE TO RELATED APPLICATIONS

This application is a national stage entry according to 35 U.S.C. 371 of International Application No. PCT/JP2018/020286 filed on May 28, 2018, which claims priority to Japanese Patent Application No. 2017-105734 filed on May 29, 2017, the contents of which are entirely incorporated herein by reference.

TECHNICAL FIELD

The present disclosure relates to, for example, a sample holder used for holding each sample such as a semiconductor wafer in a fabrication process or the like of a semiconductor integrated circuit.

BACKGROUND

As a sample holder used for holding each sample such as a semiconductor wafer in a fabrication process or the like of a semiconductor integrated circuit, there is known a sample holder including a plate-like insulating substrate including a sample holding surface on an upper surface thereof and a heat-generating resistor disposed on a lower surface of the insulating substrate. Some of the sample holders described above may have a problem that the heat-generating resistor is peeled off from the insulating substrate due to thermal stress generated by a thermal expansion difference between the insulating substrate and the heat-generating resistor.

As means for solving the above-described problem, for example, a wafer heating device disclosed in Japanese Unexamined Patent Publication JP-A 2006-13199 (hereinafter referred to as Patent Literature 1) includes a plate-like ceramic body including a sample holding surface on one main surface, and a heat-generating resistor which is disposed on the other main surface of the ceramic body and whose surface is an uneven surface. The wafer heating device disclosed in Patent Literature can disperse the thermal stress generated in the heat-generating resistor under the heat cycle because the surface of the heat-generating resistor is the uneven surface, whereby it is possible to reduce a possibility that the heat-generating resistor is peeled off from the ceramic body.

SUMMARY

A sample holder of one embodiment of the disclosure includes: a ceramic body including a one main surface, and a sample holding surface on the one main surface; a heat-generating resistor disposed on an other main surface of the ceramic body; a plurality of grooves arranged in a lattice on a surface of the heat-generating resistor, the plurality of grooves having extending directions that are different on different portions of the surface of the heat-generating resistor.

BRIEF DESCRIPTION OF DRAWINGS

FIG. 1 is a longitudinal sectional view showing an example of a sample holder according to the disclosure;

DETAILED DESCRIPTION

An example of a sample holder 10 of the disclosure will be described in detail with reference to the drawings.

FIG. 1 is a longitudinal sectional view showing the sample holder 10 according to an example of the disclosure. As shown in FIG. 1, the sample holder 10 includes a ceramic body 1 including a one main surface, and a sample holding surface 11 on the one main surface and a heat-generating resistor 2 disposed on an other main surface of the ceramic body 1.

The ceramic body 1 is a member for holding a sample. A shape of the ceramic body 1 is, for example, a disk shape. The ceramic body 1 includes the sample holding surface 11 on one main surface thereof. The ceramic body 1 includes a ceramic material such as, for example, alumina, aluminum nitride, silicon nitride, or yttria. For example, when the ceramic body 1 is a disk-shape, dimensions of the ceramic body 1 can be set such that a diameter of the main surface is 200 to 500 mm and a thickness thereof is 0.5 to 15 mm.

When the sample holder 10 holds the sample by electrostatic force, the ceramic body 1 may include an adsorption electrode (not shown) thereinside. The adsorption electrode is composed of two electrodes. One of the two electrodes is connected to a positive electrode of a power supply, and the other is connected to a negative electrode thereof. The two electrodes are respectively formed in an approximately semicircular plate shape and disposed inside the ceramic body 1 so that semicircular chords are opposite to each other. These two electrodes are combined, thereby forming a circular outer shape of the whole adsorption electrode. A center of the circular outer shape formed by the whole adsorption electrode also can be the same as a center of the outer shape of the ceramic body 1 of the circular shape. The adsorption electrode includes, for example, a metallic material such as platinum, tungsten or molybdenum.

The heat-generating resistor 2 is a member that generates heat by applying a voltage. The heat generated by the heat-generating resistor 2 is transferred through an inside of the ceramic body 1 and reaches the sample holding surface 11. Thus, the heat-generating resistor 2 can heat the sample. The heat-generating resistor 2 is disposed on the other main surface of the ceramic body 1. The heat-generating resistor 2 includes, for example, a linear pattern having a plurality of folded back parts. The heat-generating resistor 2 includes, for example, a metallic material such as silver palladium, platinum, aluminum or gold. Further, the heat-generating resistor 2 may also contain a glass component such as an oxide of a material such as silicon, aluminum, bismuth, calcium, boron or zinc. Dimensions of the heat-generating resistor 2 may be set to, for example, 0.3 to 2.0 mm in width, 0.2 to 1.0 mm in thickness, and 1000 to 20000 mm in total length.

Figure 2A:
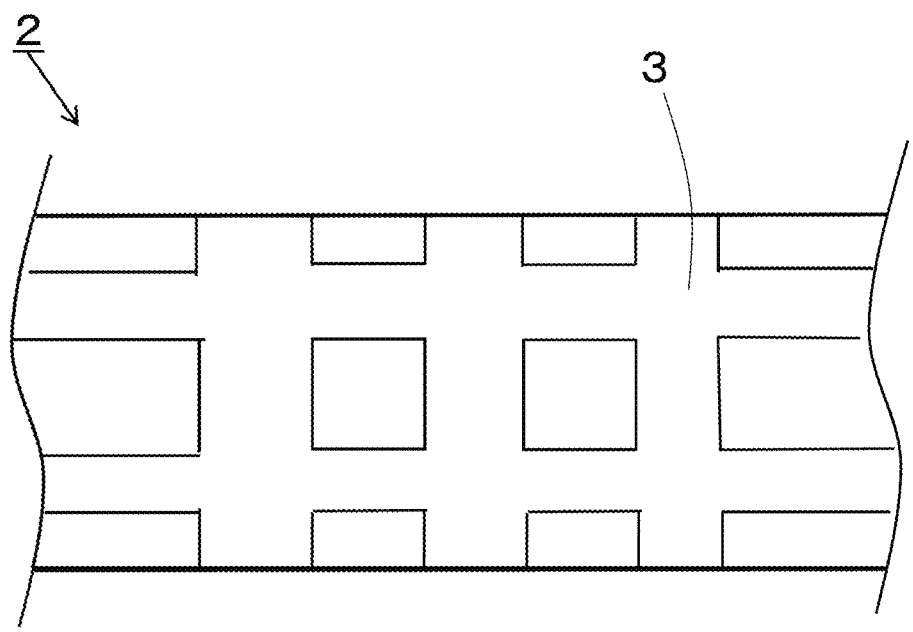
FIG. 2A is a plan view of a surface of a heat-generating resistor at a portion A of FIG. 1 when viewed from an opposite side of a ceramic body.

As shown in FIG. 2A, lattice-like grooves 3 are arranged on the surface of the heat-generating resistor 2. When the shape of the heat-generating resistor 2 has a belt shape, the lattice-like grooves 3 are arranged on, for example, the surface of the heat-generating resistor 2 opposite to the surface of the heat-generating resistor 2 facing the ceramic body. Thus, the thermal stress generated in the heat-generating resistor 2 under the heat cycle can be dispersed. Therefore, it is possible to reduce a possibility that the heat-generating resistor 2 is peeled off from the ceramic body 1.

The dimensions of the lattice-like grooves 3 may be set to, for example, 0.01 to 0.06 mm in width, 0.01 to 0.3 mm in depth, and 0.3 to 4 mm in length. For example, 20 to 150 pieces of lattice-like grooves 3 are provided per 1 mm, and the interval between the adjacent grooves is, for example, 0.01 to 0.06 mm.

The lattice-like grooves 3 described herein indicate a state in which a plurality of parallel grooves are provided so as to intersect with a plurality of other parallel grooves. For example, in a portion of the heat-generating resistor 2 shown in FIG. 2A, three parallel grooves are provided so as to intersect with the two parallel grooves.

Figure 2B:
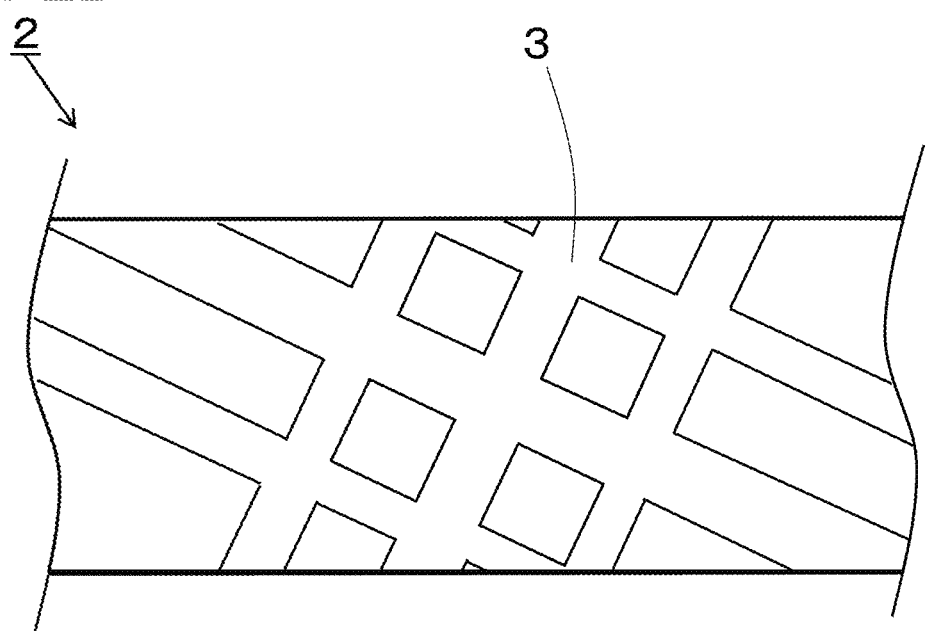
FIG. 2B is a plan view of a surface of a heat-generating resistor at a portion B of FIG. 1 when viewed from the opposite side of the ceramic body.

According to the sample holder 10 of the disclosure, as shown in FIGS. 2A and 2B, the lattice-like grooves 3 have extending directions that are different on different portions of the surface of the heat-generating resistor 2. Thus, the extending directions of the lattice-like grooves 3 can be shifted depending on portions of the heat-generating resistor 2. Therefore, when the thermal stress is generated in the heat-generating resistor 2 under the heat cycle, it is possible to reduce a possibility that the thermal stress is concentrated on the extending direction of the lattice-like groove 3. Accordingly, it is possible to reduce a possibility that the heat-generating resistor 2 is peeled off from the ceramic body 1 in a specific direction.

Further, since the lattice-like grooves 3 have the extending directions that are different on different portions of the surface of the heat-generating resistor 2, even though a crack occurs in the heat-generating resistor 2 due to the external force applied to the heat-generating resistor 2, it is possible to reduce a possibility that a crack develops at a stretch along the extending direction of the groove. As a result, the durability of the sample holder 10 can be improved.

As a structure in which the extension directions of the lattice-like grooves 3 are different on different portions of the surface of the heat-generating resistor 2, for example, there is a structure in which the extension directions of the lattice-like grooves 3 are different depending on the plurality of blocks when the other main surface of the ceramic body 1 is divided into the plurality of blocks. FIG. 3 shows an example in which the other main surface of the ceramic body 1 is divided into a plurality of blocks. Further, in the ceramic body 1 shown in FIG. 3, the heat-generating resistor 2 is omitted for easy understanding.

Figure 3A:
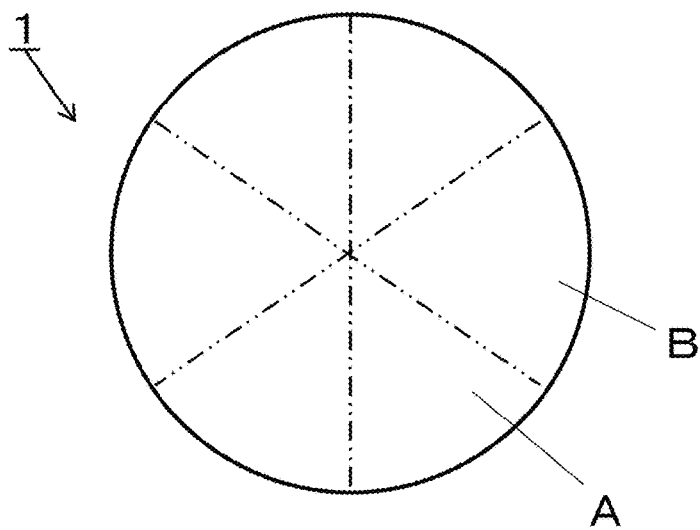
FIG. 3A is a view showing an example when the other main surface of the ceramic body is divided into a plurality of blocks.

For example, in FIG. 3A, the other main surface of the ceramic body 1 is divided into a plurality of blocks by dividing the other main surface of the ceramic body 1 into a plurality of equal portions in the circumferential direction.

In this case, when the extending directions of the lattice-like grooves 3 are different for each block, the extending directions of the lattice-like grooves 3 can be different on different portions of the surface of the heat-generating resistor 2. For example, in FIG. 3A, when the other main surface of the ceramic body 1 is divided into six equal portions in the circumferential direction, a block A and a block B are compared with each other.

Further, the "divided into equal portions" described herein is not required to be "divided into equal portions" in a strict sense, and if a difference in the area of each block is within 20% of the area of each block, it is considered to be divided into equal portions in the circumferential direction. Further, a region where the lattice-like groove 3 is not provided may exist between the adjacent blocks.

Figure 3B:
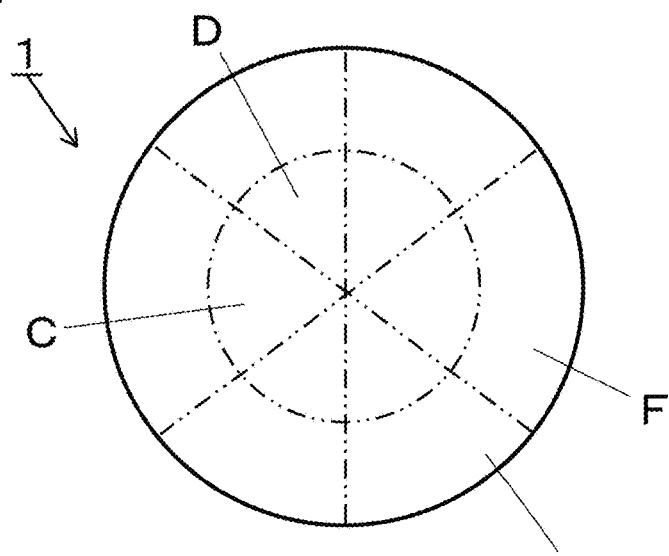
FIG. 3B is a view showing another example when the other main surface of the ceramic body is divided into a plurality of blocks.

Further, the plurality of blocks may be divided more finely than the example shown in FIG. 3A. For example, as shown in FIG. 3B, the other main surface of the ceramic body 1 is first divided into two portions in the radial direction, and divided into a circular portion and an annular portion. In this case, when the circular portion is divided into a plurality of equal portions in the circumferential direction, if the extending directions of the lattice-like grooves 3 in respective blocks of the circular portion are different from each other, the extending directions of the lattice-like grooves 3 can be different on different portions of the surface of the heat-generating resistor 2. In FIG. 3B, a block C and a block D are compared with each other. Further, when the annular portion is divided into a plurality of equal portions in the circumferential direction, even in a case where the extending directions of the lattice-like grooves 3 in respective annular blocks are different from each other, in the same manner, the extending directions of the lattice-like grooves 3 can be different on different portions of the surface of the heat-generating resistor 2. In FIG. 3B, a block E and a block F are compared with each other.

Figure 3C:
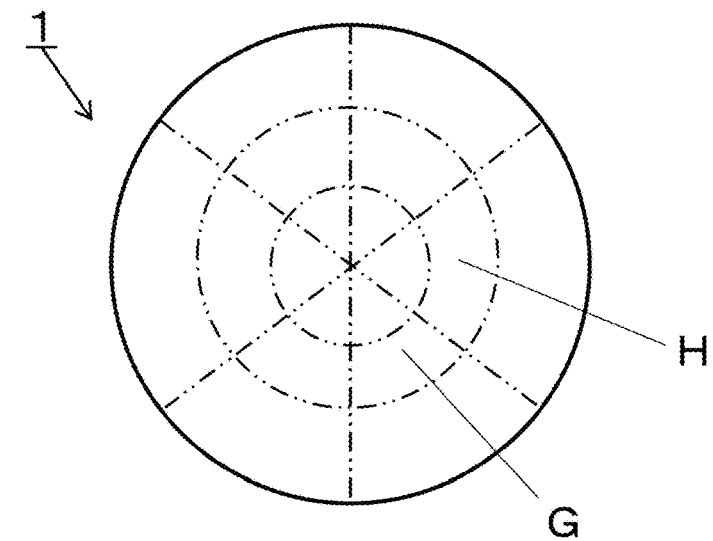
FIG. 3C is a view showing another example when the other main surface of the ceramic body is divided into a plurality of blocks.

Further, as another example, as shown in FIG. 3C, the other main surface of the ceramic body 1 is divided into three or more blocks in the radial direction. At this time, the other main surface of the ceramic body 1 is divided into a circular portion and a plurality of annular portions. In this case, when one portion of the plurality of annular portions is divided into a plurality of equal portions in the circumferential direction, if the extending directions of the lattice-like grooves 3 are different in respective blocks, the extending directions of the lattice-like grooves 3 can be different on different portions of the surface of the heat-generating resistor 2. In FIG. 3C, a block G and a block H are compared with each other.

Further, in order to provide the lattice-like grooves 3 on the surface of the heat-generating resistor 2, a laser trimming device can be used. Further, by shifting the direction of performing the laser trimming depending on the blocks, it is possible to form a shape in which the extending directions of the lattice-like grooves 3 are different on different portions of the surface of the heat-generating resistor 2. Further, the extending directions of the lattice-like grooves 3 can be examined, for example, by observing the surface of the heat-generating resistor 2 with a scanning electron microscope (SEM).

Figure 4:
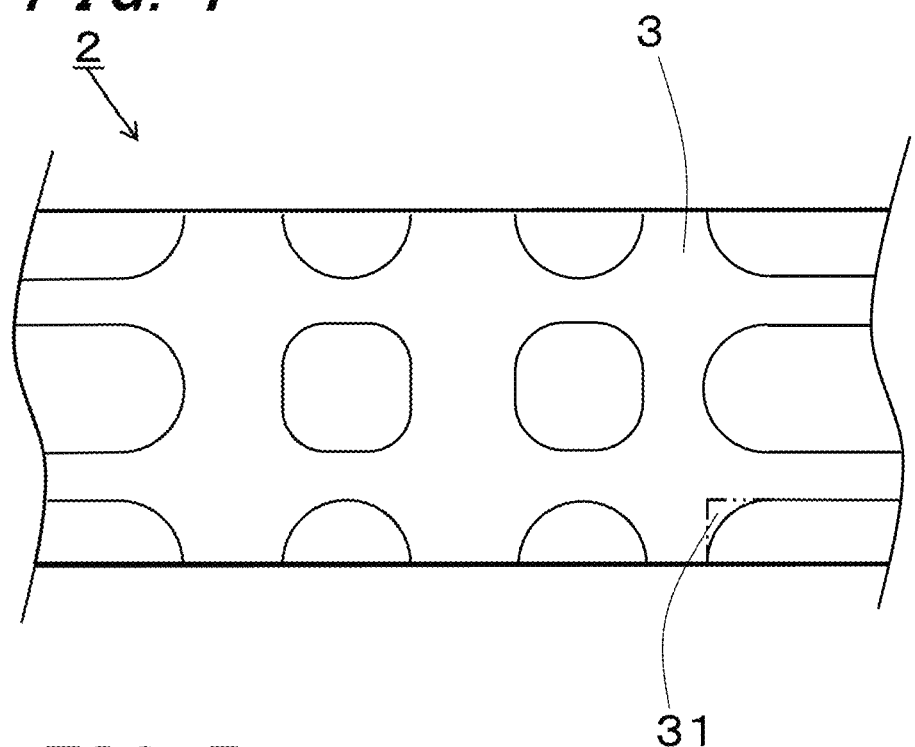
FIG. 4 is a plan view of the surface of a heat-generating resistor according to another example when viewed from the opposite side of the ceramic body.

Further, the lattice-like grooves 3 are not limited to those provided to vertically intersect with each other, but may be provided to obliquely intersect with each other. Further, the groove is not limited to one having a constant width. When it is linearly extended and includes depth and width, it can be regarded as a groove. For example, as shown in FIG. 4, the lattice-like groove 3 may include a wide portion 31 partially extending outward. Further, the lattice-like grooves 3 may include the wide portion 31 so as to eliminate a corner of a portion surrounded by the grooves. Further, the portion surrounded by the lattice-like grooves 3 may be formed as a convex part, and may be arranged on the surface of the heat-generating resistor 2 at equal intervals.

Further, as shown in FIG. 4, a corner of a portion of different portions of the heat-generating resistor 2 which is surrounded by the lattice-like grooves 3 may have an R shape, that is, a rounded shape in a plan view of the heat-generating resistor 2. When the lattice-like grooves 3 are arranged on the surface of the heat-generating resistor 2, since the thermal stress is easily concentrated on the corner of the portion of different portions of the heat-generating resistor 2 which is surrounded by the lattice-like grooves 3, there is a tendency that a crack easily occurs starting from the corner of the portion of different portions of the heat-generating resistor which is surrounded by the lattice-like grooves 3 as a starting point. On the other hand, since the corner of the portion of different portions of the heat-generating resistor which is surrounded by the lattice-like grooves 3 has the R shape, the stress generated in the corner of the portion of different portions of the heat-generating resistor which is surrounded by the lattice-like grooves 3 can be dispersed. Therefore, it is possible to reduce the possibility of the crack occurring in the heat-generating resistor 2 starting from the corner of the portion of different portions of the heat-generating resistor which is surrounded by the lattice-like grooves 3 as a starting point. As a result, the durability of the sample holder 10 can be improved.

Figure 5:
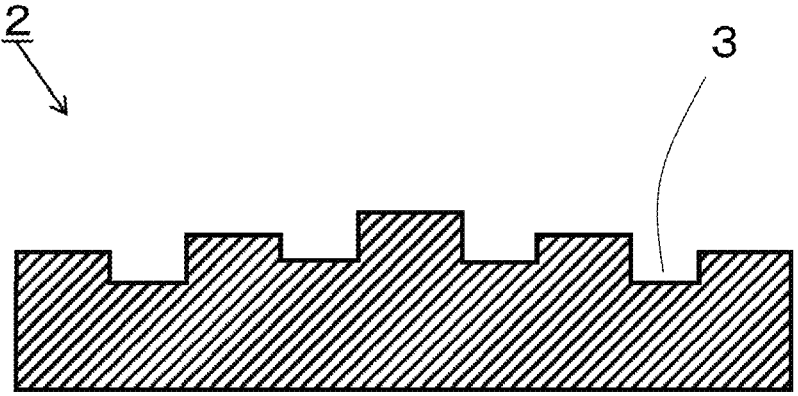
FIG. 5 is a longitudinal sectional view of a heat-generating resistor according to another example.

Further, as shown in FIG. 5, when the heat-generating resistor 2 has a belt shape and the heat-generating resistor 2 is viewed in a cross section perpendicular to a length direction thereof, opposite ends of the heat-generating resistor 2 may be thinner than the center of the heat-generating resistor 2. When the heat-generating resistor 2 has the belt shape, tensile stress tends to be easily applied to the opposite ends of the heat-generating resistor 2 when the heat-generating resistor 2 is viewed in the cross section perpendicular to the length direction. Since the heat-generating resistor 2 includes thinner opposite ends, the thermal stress applied to the opposite ends of the heat-generating resistor 2 can be reduced. Therefore, it is possible to reduce a possibility that peeling occurs at the opposite ends of the heat-generating resistor 2. Further, since the center of the heat-generating resistor 2 is thicker than the opposite ends thereof, the cross-sectional area when the heat-generating resistor 2 is viewed in the cross section perpendicular to the length direction can be adjusted. Therefore, it is possible to reduce a possibility that a resistance value per unit length of the heat-generating resistor 2 changes. As a result, it is possible not only to maintain the soaking property of the sample holding surface 11, but also to improve the durability of the sample holder 10.

Here, when even a portion of the center of the heat-generating resistor 2 is thicker than the opposite ends of the heat-generating resistor 2, the heat-generating resistor 2 can be considered as including the opposite ends of the heat-generating resistor 2 thinner than the center of the heat-generating resistor 2. Further, the center of the heat-generating resistor 2 described herein indicates a central portion when the width of the heat-generating resistor 2 is divided into three equal portions.

Figure 6:
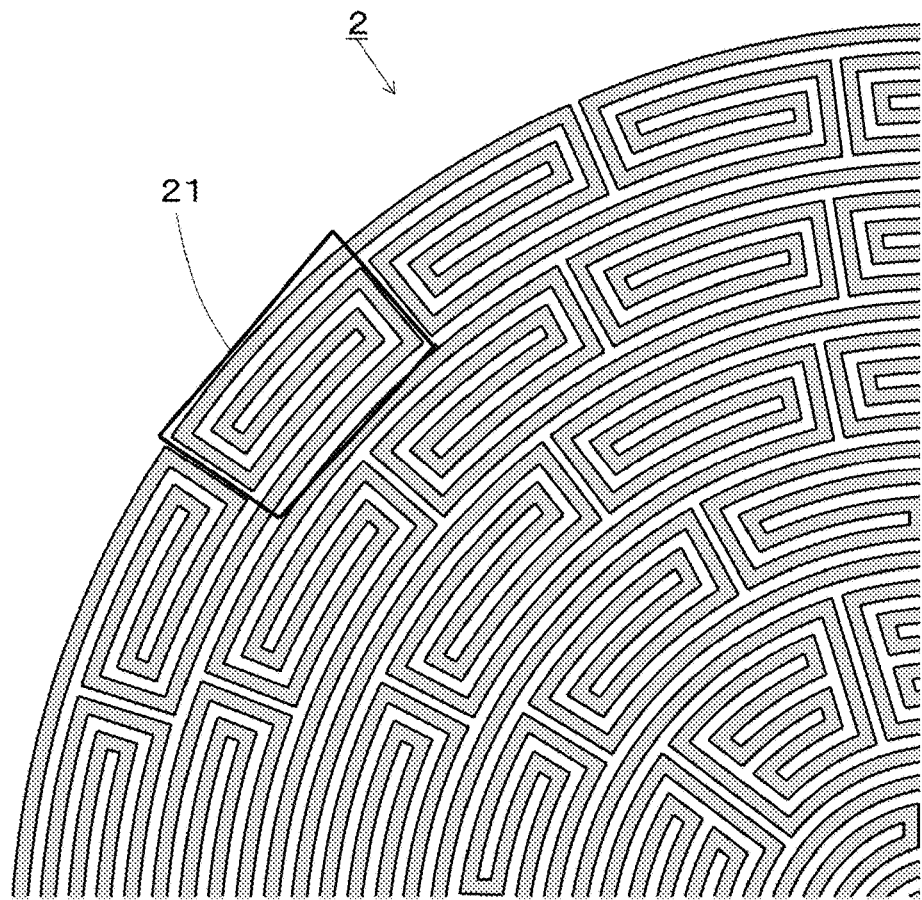
FIG. 6 is a view showing an example of a heat-generating resistor pattern in another example.

Further, as shown in FIG. 6, the heat-generating resistor 2 may includes a wiring group in which a plurality of double-rectangular spiral patterns 21 are centrally folded back, are arranged on a circumference of a circle having a center positioned at a center part of the ceramic body, and are electrically connected to each other. Thus, a plurality of finely folded back parts can be disposed. When the heat-generating resistor 2 includes the folded back parts, there is a possibility that different electromagnetic waves are emitted at the folded back parts, but portions where the different electromagnetic waves are emitted can be spread substantially uniformly over a wide range of the main surface by providing a plurality of folded back parts which are finely folded back. Therefore, when the film formation or etching of a sample is performed, it is possible to reduce a possibility that the different electromagnetic waves affect the sample non-uniformly and thus variations in thickness of the sample occur.

Here, FIG. 6 partially shows a wiring pattern of the heat-generating resistor 2. Specifically, FIG. 6 shows a quadrant state in which a circular region is divided into four equal portions among the wiring patterns formed in the circular region on the other main surface of the ceramic body 1. As shown in FIG. 6, the wiring pattern of the heat-generating resistor 2 includes the wiring group in which the plurality of rectangular spiral patterns 21 are electrically connected to each other. At this time, one block of the wiring patterns of the heat-generating resistor 2, which is rectangle and in which the wiring of the heat-generating resistor 2 is centrally folded back to be double, can be defined as the rectangular spiral pattern 21. Further, the rectangle described herein is not required to be a rectangle in a strict sense, and for example, as shown in FIG. 6, a portion corresponding to the side of the rectangle may be a gently circular arc shape.

Further, the extending directions of the lattice-like grooves 3 provided on the surface of the heat-generating resistor 2 may be different for different rectangular spiral patterns of the plurality of rectangular spiral patterns 21. In this case, one rectangular spiral pattern 21 corresponds to one block of the plurality of virtual blocks shown in FIG. 3C. As described above, since the wiring pattern of the heat-generating resistor 2 includes the above-described wiring group such that the plurality of finely folded back parts can be provided, it is possible to reduce a possibility that variations in thickness of the sample occur when the film formation and etching are performed. In addition thereto, the extending directions of the lattice-like grooves 3 are aligned in one rectangular spiral pattern 21, whereby it is possible to suppress variations in the directivity of the electromagnetic waves in the rectangular spiral pattern 21. As a result, the soaking property of the sample holder 10 can be improved.

Further, since the extending directions of the lattice-like grooves 3 are different for different rectangular spiral patterns of the plurality of rectangular spiral patterns 21, the extending directions of the lattice-like grooves 3 can be prevented from being aligned in the whole heat-generating resistor 2. Accordingly, it is possible to reduce a possibility that the thermal stress generated in the heat-generating resistor 2 is concentrated on a specific direction in the whole heat-generating resistor 2. Accordingly, it is possible to reduce a possibility of a crack occurring between the ceramic body 1 and the heat-generating resistor 2 in a portion on which the thermal stress is concentrated. As a result, the durability of the sample holder 10 can be improved.

Figure 7:
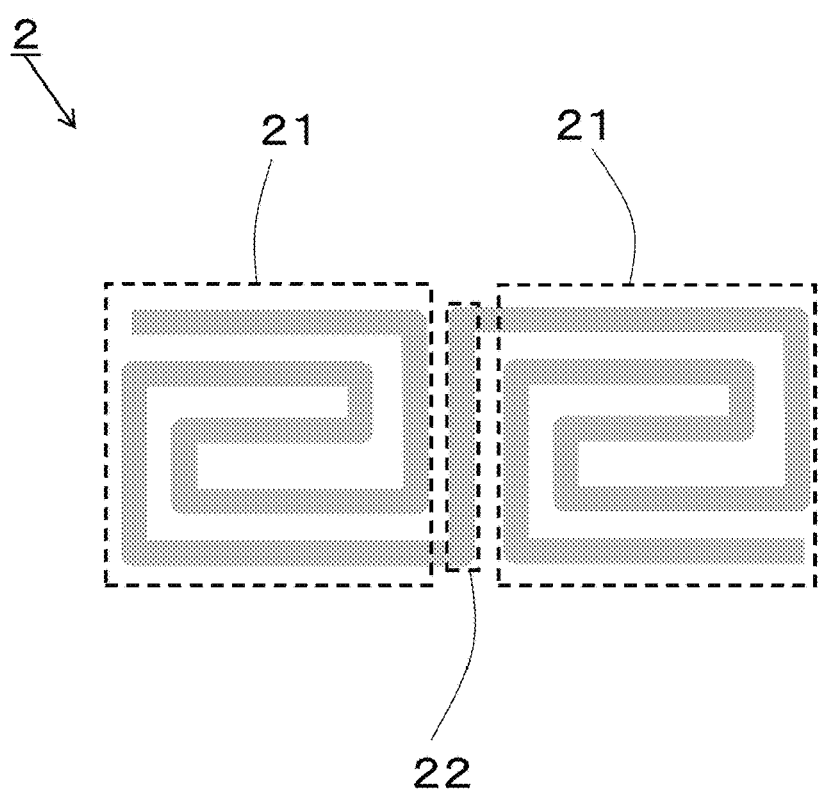
FIG. 7 is an enlarged view of part of the heat-generating resistor pattern according to another example.

Further, as shown in FIG. 7, the heat-generating resistor may be thickened between the adjacent rectangular spiral patterns 21. Here, a portion between the adjacent rectangular spiral patterns 21 is defined as a connection portion 22. For example, when the extending directions of the lattice-like grooves 3 provided on the surface of the heat-generating resistor 2 are different for different rectangular spiral patterns of the plurality of rectangular spiral patterns 21, the connection portion 22 is a portion where the extending directions of the lattice-like grooves 3 change. That is, the connection portion 22 is a portion where the direction in which stress is easily applied changes. Therefore, the connection portion 22 tends to be easily applied with stress in comparison with the rectangular spiral pattern 21.

According to the sample holder 10 of one embodiment of the disclosure, the heat-generating resistor 2 is thickened at the connection portion 22, whereby it is possible to efficiently improve the strength of the connection portion 22 which tends to be easily applied with the stress in comparison with the rectangular spiral pattern 21. As a result, the durability of the sample holder 10 can be improved. Specifically, the thickness of the heat-generating resistor 2 in the rectangular spiral pattern 21 may be set to, for example, 0.2 to 0.5 mm, and the thickness of the heat-generating resistor 2 in the connection portion 22 may be 0.4 to 1.0 mm. Further, the lattice-like groove 3 may not be provided in the connection portion 22.

Figure 8:
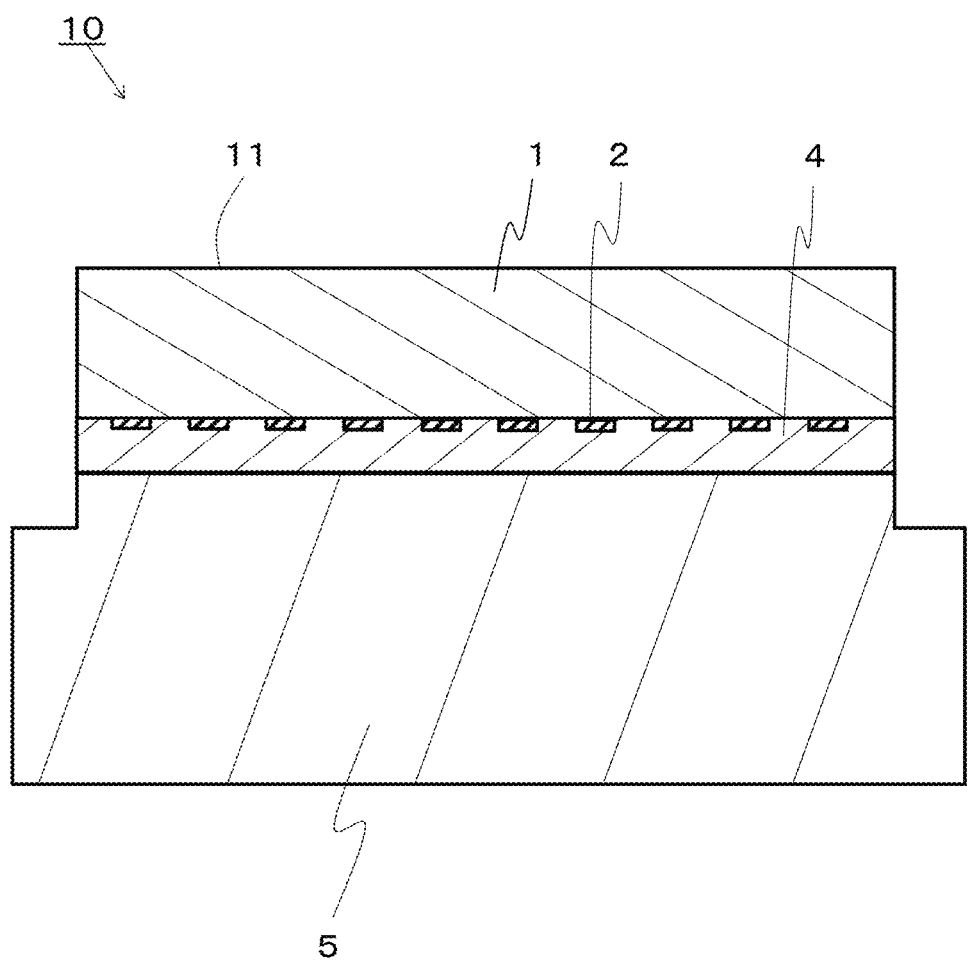
FIG. 8 is a longitudinal sectional view showing an example of a sample holder according to another example.

Further, as shown in FIG. 8, a metal plate 5 may be joined to the other main surface of the ceramic body 1 via a joining layer 4 that covers the other main surface of the ceramic body 1 and the heat-generating resistor 2. Accordingly, the joining layer 4 can enter the lattice-like groove 3 provided on the surface of the heat-generating resistor 2. Therefore, the joint strength between the joining layer 4 and the heat-generating resistor 2 can be improved by the anchor effect. As a result, the durability of the sample holder 10 can be improved.

Further, a contact area between the heat-generating resistor 2 and the joining layer 4 can be increased by allowing the joining layer 4 to enter the lattice-like grooves 3 provided on the surface of the heat-generating resistor 2. Accordingly, the heat generated in the heat-generating resistor 2 can be easily transferred to the metal plate 5 via the joining layer 4. As a result, the cooling performance of the metal plate 5 can be improved.

The joining layer 4 is a member for joining the ceramic body 1 and the metal plate 5. The joining layer 4 joins the other main surface of the ceramic body 1 with the main surface of the metal plate 5. A resin material such as epoxy or silicon can be used as the joining layer 4. The thickness of the joining layer 4 may be set to, for example, 0.1 to 2.0 mm.

The metal plate 5 is provided for the purpose of releasing the heat generated in the heat-generating resistor 2 to the lower surface thereof via the joining layer 4. The "metal" described herein also includes a composite material formed of metal such as a composite material of ceramics and metal and fiber reinforced metal. Generally, when the sample holder 10 is used in an environment exposed to halogen-based corrosive gas, aluminum (Al), copper (Cu), stainless steel, nickel (Ni) or an alloy of these metals may be used as the metal constituting the metal plate 5. The dimensions of the metal plate 5 may be set to, for example, 50 to 400 mm in diameter and 10 to 40 mm in thickness. Further, the structure of the metal plate 5 is not particularly limited, but may be provided with a cooling flow path for circulating a heat medium such as gas or liquid. In this case, liquid such as water or silicone oil or gas such as helium (He) or nitrogen ($N_2$) can be used as the heat medium.

Further, when the metal plate 5 is joined to the other main surface of the ceramic body 1 via the joining layer 4 that covers the other main surface of the ceramic body 1 and the heat-generating resistor 2, the surface of the heat-generating resistor 2 can be analyzed by looking at the surface of the heat-generating resistor 2 with a scanning electron microscope (SEM) after the joining layer 4 and the metal plate 5 are separated from the heat-generating resistor 2.

REFERENCE SIGNS LIST

1: Ceramic body
11: Sample holding surface
2: Heat-generating resistor
21: Rectangular spiral pattern
22: Connection portion
3: Lattice-like groove
31: Wide portion
4: Joining layer
5: Metal plate
10: Sample holder

The invention claimed is:
1. A sample holder, comprising:
a ceramic body comprising a one main surface, and a sample holding surface on the one main surface;
a heat-generating resistor disposed on an other main surface of the ceramic body, a surface of the heat-generating resistor being divided into a first portion extending on the surface along an extending direction of the heat-generating resistor, and a second portion extending on the surface along the extending direction of the heat-generating resistor;
the first portion including a first plurality of linearly extending grooves that intersect each other within the first portion to form a lattice that extends within the first portion in a first direction relative to the extending direction of the heat-generating resistor,
the second portion including a second plurality of linearly extending grooves that intersect each other within the second portion to form a lattice that extends within the second portion in a second direction relative to the extending direction of the heat-generating resistor;
wherein the first direction differs from the second direction relative to the extending direction of the heat-generating resistor.

2. The sample holder according to claim 1, wherein a corner of a portion of the first and second portions of the heat-generating resistor which is surrounded by the plurality of grooves has a rounded shape in a plan view of the heat-generating resistor.

3. The sample holder according to claim 1, wherein when the heat-generating resistor has a belt shape, and when the heat-generating resistor is viewed in a cross section perpendicular to a length direction thereof, opposite ends of the heat-generating resistor are thinner than a center of the heat-generating resistor.

4. The sample holder according to claim 1, wherein a wiring pattern of the heat-generating resistor comprises a wiring group in which a plurality of double-rectangular spiral patterns are centrally folded back, are arranged on a circumference of a circle having a center positioned at a center part of the ceramic body, and are electrically connected to each other, and
wherein the extending directions of the plurality of grooves are different for different double-rectangular spiral patterns of the plurality of double-rectangular spiral patterns.

5. The sample holder according to claim 4, wherein the heat-generating resistor comprises a connection portion that connects the plurality of double-rectangular spiral patterns, and the connection portion is thicker than each double-rectangular spiral pattern of the plurality of double-rectangular spiral patterns.

6. The sample holder according to claim 1, wherein a metal plate is joined to the other main surface via a joining layer that covers the other main surface and the heat-generating resistor.

* * * * *